United States Patent [19]
Chan et al.

[11] Patent Number: 6,128,243
[45] Date of Patent: Oct. 3, 2000

[54] SHADOW MEMORY FOR A SRAM AND METHOD

[75] Inventors: Tsiu C. Chan, Carrollton; Jim Brady, Plano; Pervez Hassan Sagarwala, Arlington, all of Tex.

[73] Assignee: STMicroelectronics, Inc., Carrollton, Tex.

[21] Appl. No.: 09/454,697

[22] Filed: Dec. 3, 1999

Related U.S. Application Data

[62] Division of application No. 09/145,312, Aug. 31, 1998, Pat. No. 6,034,886.

[51] Int. Cl.$^7$ ...................................................... G11C 7/00
[52] U.S. Cl. .................... 365/227; 365/226; 365/185.02; 365/185.08; 365/174; 365/188
[58] Field of Search ..................................... 365/226, 227, 365/185.02, 185.08, 174, 188

[56] References Cited

U.S. PATENT DOCUMENTS

| 5,548,550 | 8/1996 | Zanders et al. | 365/185.08 |
|---|---|---|---|
| 5,742,557 | 4/1998 | Gibbins et al. | 365/230.05 |
| 5,896,330 | 4/1999 | Gibson | 365/201 |
| 6,026,018 | 2/2000 | Herdt et al. | 365/185.07 |
| 6,034,886 | 3/2000 | Chan et al. | 365/154 |

*Primary Examiner*—Viet Q Nguyen
*Attorney, Agent, or Firm*—David V. Carlson; Theodore E. Galanthay; Lisa K. Jorgenson

[57] ABSTRACT

A method of operating a memory cell includes detecting a first power supply anomaly or condition. When the first power supply condition occurs, memory cell access to bit lines is disabled, a series of shadow memory access FETs within the memory cells are enabled and data from the memory cells are coupled to memory FETs within the memory cells to store data corresponding to the data from the memory cells in the memory FETs. The memory FETs include nanocrystals of semiconductor material in gate dielectrics of the FETs. Electrons are stored in the nanocrystals of semiconductor material to represent the data stored in the memory cell. When a second power supply condition is detected, the data stored in the memory FETs are written back to the memory cells.

11 Claims, 3 Drawing Sheets

SHADOW MEMORY FOR A SRAM AND METHOD

CROSS-REFERENCE TO RELATED APPLICATION

This application is a division of pending U.S. patent application Ser. No. 09/145,312, filed Aug. 31, 1998, now U.S. Pat. No. 6,034,886.

TECHNICAL FIELD

The present invention relates generally to semiconductor integrated circuits, and more specifically to a shadow memory for a SRAM for storing data in the event of a power supply voltage hiatus or failure.

BACKGROUND OF THE INVENTION

Programmable digital memories generally are either nonvolatile or volatile. A nonvolatile memory is able to store information for a period of time or indefinitely, with or without electrical power being supplied to it, but such memories tend also to be relatively slow, and, in particular, often require long write times. Volatile memories are unable to continue to store information unless electrical power is continuously supplied to them, but are often much faster than nonvolatile memories.

One type of volatile memory is known as RAM or random access memory. RAMs are used in a variety of digital equipment for read-write memory, where speed and accuracy are both important. RAMs are easily written to and can provide very rapid access to stored data.

SRAMs, or static random access memories, require more silicon area per memory cell than do DRAMs, or dynamic random access memories. Additionally, SRAMs typically consume more electrical power per bit than do DRAMs. As a result, SRAMs are typically used in situations where their increased operating speed provides critical system performance advantages over DRAMs. A typical SRAM memory cell includes between four and six FETs, with two of the FETs forming bit line transfer devices and two to four FETs coupled to provide cross-coupled inverters forming a latch.

During a memory write operation, the bit line transfer devices are turned ON and the cross-coupled inverters forming the SRAM memory cell are driven to one of two possible logical states, thereby writing data to the SRAM memory cell. The bit line transfer devices are then turned OFF and the cross-coupled inverters maintain the logical states that they were placed in during the memory write operation.

During a memory read operation, the bit line transfer devices are turned ON, and the outputs of the cross-coupled inverters forming the SRAM memory cell are coupled to a sensing circuit that reads the logical state of the cross-coupled inverters. At the conclusion of the memory read operation, the bit line transfer devices are turned OFF, and the SRAM memory cell continues to store the data previously written to the SRAM memory cell.

The cross-coupled inverters forming the SRAM memory cell typically have no provision for storing data when no electrical power is being supplied to the SRAM. As a result, data stored in the SRAM are lost when power supply failures occur.

One prior art approach for providing a nonvolatile memory function in an SRAM stores data from the SRAM memory cell in an associated flash memory cell that is built into the SRAM memory cell. When a power supply anomaly is detected in the SRAM power supply, all word lines to the SRAM are turned OFF, and an internal high voltage power supply is turned ON. The internal high voltage power supply provides an elevated voltage such as 15 volts. When the internal high voltage power supply has equilibrated, shadow memory access FETs are turned ON and the flash memory cell stores the data that is stored in their associated SRAM memory cell. The flash memory cells then maintain the stored data, whether the SRAM power supply continues to operate or not.

Following return of the SRAM power supply to a normal condition, the word lines are turned OFF and the shadow memory access FETs are turned ON. The data stored in the flash memory cells are read back into the associated SRAM memory cells, restoring the data that were stored in the SRAM before the SRAM power supply exhibited the anomaly. The SRAM is then returned to normal operation.

Disadvantages to this approach include the need to be able to generate the internal high voltage and the need for circuitry to support the flash memory cell operation. Additionally, the flash memory cell itself requires additional processing steps in the manufacture of the SRAM shadow memory.

SUMMARY OF THE INVENTION

In one aspect, the present invention provides nonvolatile memory functions within an SRAM. Nonvolatile memory cells are formed within memory cells in the SRAM from pairs of cross-coupled memory FETs. Each memory FET includes conductive or semiconductor nanocrystals formed in gate dielectrics within the memory FETs. A pair of FETs having gates coupled to a control line allow each cross-coupled pair of memory FETs to be coupled to an associated SRAM memory cell in response to control signals that are generated by a detector and controller when certain power supply events occur. The pair of memory FETs are then written with data corresponding to data stored in the associated SRAM memory cell. As a result, all data stored in the SRAM are simultaneously transferred to nonvolatile memory cells whenever a power supply failure occurs. When power is restored, the data stored in the memory FETs forming the nonvolatile memory cells can be re-written back into the associated SRAM memory cells.

DETAILED DESCRIPTION OF THE INVENTION

Figure 1:
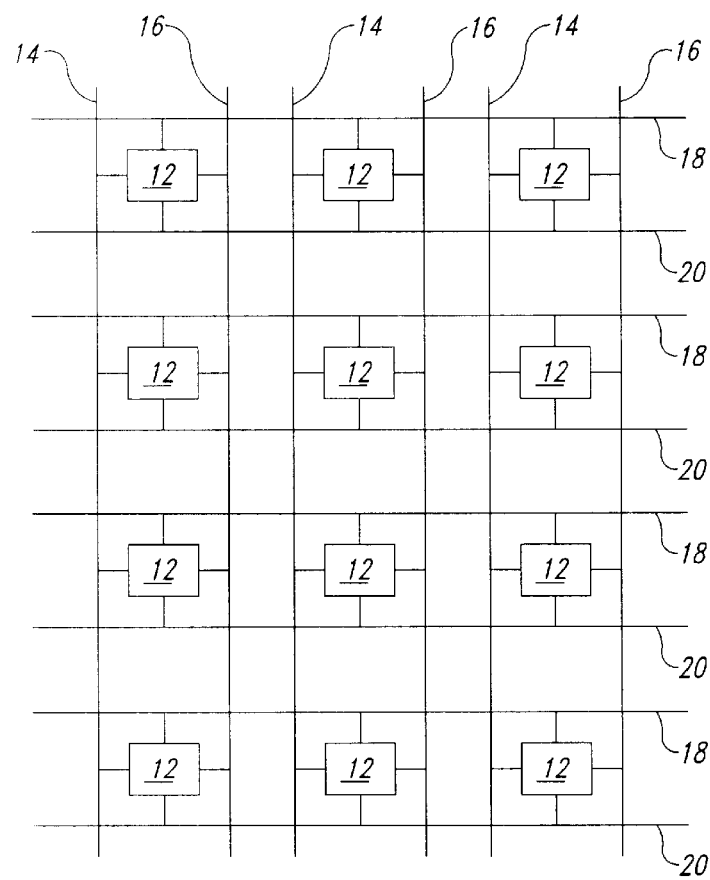
FIG. 1 is a simplified block diagram of an SRAM memory array, in accordance with embodiments of the present invention.

FIG. 1 is a simplified block diagram of an SRAM memory array 10, in accordance with embodiments of the present invention. The SRAM memory array 10 includes a plurality of SRAM memory cells 12, BIT 14 and BIT* 16 data lines and a plurality of word lines 18, with the "*" designating a signal on the line as active low or complement. Each SRAM memory cell 12 may be addressed by enabling the word line 18 that is coupled to the SRAM memory cell 12 and simultaneously activating the pair of BIT 14 and BIT* 16 data lines that are also coupled to that SRAM memory cell 12.

When data are written to the SRAM memory cell 12, the BIT 14 and BIT* 16 data lines are driven to complementary logical states representing the data to be stored, i.e., either setting the BIT 14 data line to a logical "0" and the BIT* data line 16 to a logical "1", or vice versa. In response to a logical "1" on the wordline 18 coupled to the SRAM memory cell 12, the data on the BIT 14 and BIT* 16 data lines are written to the SRAM memory cell 12. The wordline 18 that is coupled to this SRAM memory cell 12 is then returned to a logical "0", and the SRAM memory cell 12 retains the data that were written to it. When data are read from the SRAM memory cell 12, one word line 18 is activated, and the BIT 14 and BIT* 16 data lines coupled to that SRAM memory cell 12 are driven to complementary logical states by the SRAM memory cell 12. The BIT 14 and BIT* 16 data lines are then coupled to sense amplifiers (not shown) and the data are passed along to other circuitry (not shown) as required. The SRAM memory array 10 also includes a plurality of control lines 20 coupled to each of the SRAM memory cells 12, as is explained below in more detail.

Figure 2:
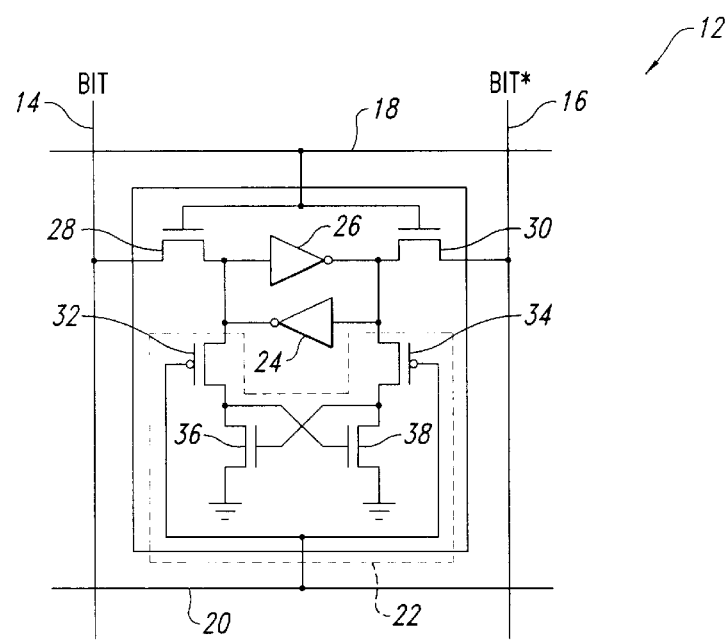
FIG. 2 is a simplified schematic diagram of SRAM memory cells making up the SRAM array of FIG. 1, each including a nonvolatile shadow memory cell, in accordance with embodiments of the present invention.

FIG. 2 is a simplified schematic diagram of the SRAM memory cell 12 including a nonvolatile shadow memory cell 22, in accordance with embodiments of the present invention. The SRAM memory cell 12 includes a pair of cross-coupled inverters 24 and 26 and a pair of bit line access FETs 28 and 30. In one embodiment, the bit line access FETs 28 and 30 are NMOS FETs. The bit line access FETs 28 and 30 have gates that are coupled to the word line 18, first electrodes that are each coupled to one output of each of the cross-coupled inverters 24 and 26 and second electrodes that are each coupled to one of the BIT 14 and BIT* 16 data lines. In response to signals that activate the word line 18, the bit line access FETs 28 and 30 are turned ON, allowing outputs of the cross-coupled inverters 24 and 26 to be coupled to the BIT 14 and BIT* 16 data lines, respectively, to read data from or write data to the SRAM memory cell 12.

Additionally, the control line 20 is coupled to gates of shadow memory access FETs 32 and 34, which are PMOS FETs in one embodiment. A first electrode of the shadow memory access FET 32 is coupled to an output of the first inverter 24 and a second electrode of the shadow memory access FET 32 is coupled to a drain of a memory FET 36. Similarly, a first electrode of the shadow memory access FET 34 is coupled to an output of the second inverter 26 and a second electrode of the shadow memory access FET 34 is coupled to a drain of a memory FET 38.

The memory FETs 36 and 38 each have a gate that is coupled to the drain of the other of the memory FETs 36 and 38 to form a cross-coupled pair of memory FETs 36 and 38. The memory FETs 36 and 38 have sources that are coupled to ground or to a negative supply voltage. The memory FETs 36 and 38 include a nonvolatile memory function through incorporation of nanocrystals of semiconductor material in gate oxides formed within the memory FETs 36 and 38, as is explained below in more detail. As used herein, the term "nanocrystal" refers to conductive material suspended in a dielectric material and having a capacitance small enough to exhibit a significant voltage change even when storing relatively small amounts of charge. A typical nanocrystal has a diameter of a few nanometers.

Figure 3:
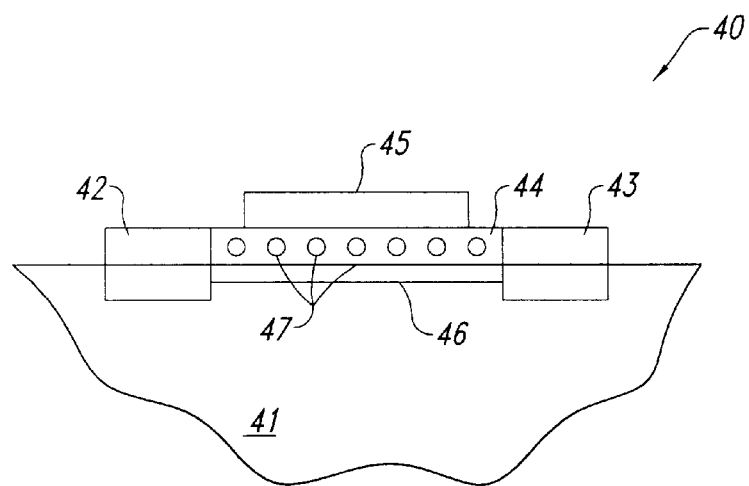
FIG. 3 is a simplified cross-sectional view of a memory FETs such as each of the memory FETs providing nonvolatile memory functions in the SRAM memory cells of FIGS. 1 and 2, in accordance with embodiments of the present invention.

FIG. 3 is a simplified cross-sectional view of a memory FET 40 such as each of the cross-coupled memory FETs 36 and 38 of FIG. 2 that provide nonvolatile memory functions, in accordance with embodiments of the present invention. The memory FET 40 includes a body of semiconductor material 41 onto which conventional source 42 and drain 43 contacts have been formed. A gate dielectric 44 is formed between the source 42 and drain 43 contacts, and a gate 45 is formed on the gate dielectric 44. In a conventional FET, in response to voltages coupled to the source 42 and drain 43 contacts and a voltage applied to the gate 45, a channel 46 is formed. The channel 46 in enhancement mode memory FETs 40 is a region including mobile charge carriers of a first conductivity type formed in semiconductor material 41 of the opposite conductivity type. For example, the semiconductor material 41 may be p-type, and the channel 46 may be an inversion region including mobile electrons that is formed in response to a voltage difference between the source 42 and the gate 45, with the gate 45 being more positive than a voltage $V_{SS}$ that is coupled to the source 42.

In the memory FET 40, a plurality of nanocrystals 47 is also included in the gate dielectric 44. In one embodiment, shallow implantation of a relatively high dose (e.g., between $5 \times 10^{14}/cm^2$ and $10^{16}/cm^2$) of silicon or germanium is carried out at relatively low energies (e.g., ca. 20 keV or 30 keV) into relatively thin (e.g., ca. five to twenty or more nanometers) silicon dioxide layers forming the gate dielectric 44. The implantation is followed by annealing, providing nanocrystals 47 of the implanted species that are insulated from each other and from the underlying silicon region 41, as described, for example, in "Fast and Long Retention-Time Nano-Crystal Memory" by H. Hanafi et al., IEEE Trans. El. Dev., Vol. 43, No. 9 (September 1996), pp. 1553–1558. Performance of memories using nanocrystals 47 in proximity to the channel 46 is discussed in "Single Charge and Confinement Effects in Nano-Crystal Memories" by S. Tiwari et al., Appl. Phys. Lett. 69(9) (Aug. 26, 1996), pp. 1232–1234. The gate 45 is formed after formation of the nanocrystals 47.

The memory FET 40 captures hot electrons on the silicon nanocrystals 47 contained in the gate dielectric 44 when the gate 45 is sufficiently positive with respect to the channel 46. The memory FET 40 also releases captured electrons over time or in response to voltages making the gate negative with respect to the semiconductor material 41. The memory FET 40 thus exhibits modified threshold voltages at different times, depending on the history of gate bias applied to the memory FET 40. The threshold voltage is shifted in proportion to the amount of charge that is stored on the silicon nanocrystals 47. The memory FET 40 including nanocrystals 47 suitable for capture of electrons thus provides measurable and repeatable changes in the electrical properties of the memory FET 40 in response to capture of electrons on the nanocrystals 47. A threshold voltage shift of 80 millivolts corresponds to an order of magnitude difference in drain-source impedance. In other words, increasing the threshold voltage by 80 millivolts will cause a sub-threshold drain current decrease by a factor of ten at a given voltage applied to the gate 45 for a given voltage difference between the source 42 and the drain 43.

Additionally, energy barriers surrounding the nanocrystals 47 cause the memory FET 40 to store trapped electrons for significant periods of time, even in the absence of externally applied electrical power. As a result, a nonvolatile memory function may be provided by the memory FET 40.

Choosing the appropriate thickness for the gate dielectric 44 and the proper dose and implant energy for forming the silicon or germanium nanocrystals 47 allows the storage voltage required between the channel 46 and the gate 45 for tunneling of mobile charge carriers from the channel 46 into the nanocrystals 47 to store electrons on the nanocrystals 47 to be tailored to a particular application. The choice of thickness for the gate dielectric 44 and the dose and implant energy also affect the erase voltage required for electrons to tunnel out of the nanocrystals 47 and back into the semiconductor material 41 to remove stored electrons from the nanocrystals 47 and can allow the erase voltage that is applied to the gate to remove the stored electrons to be tailored to a particular application. The thickness of the dielectric 44 surrounding the nanocrystals 47 also affects the length of time that electrons will be stored on the nanocrystals 47 in the absence of external electrical stimuli. In general, storage times, storage voltages and erase voltages all generally decrease or increase exponentially together for a given set of conditions. For example, storage times and erase voltages for a given device decrease with increasing temperature, because the dominant mechanism for electrons to escape from the nanocrystals 47 is through thermal excitation.

Figure 4:
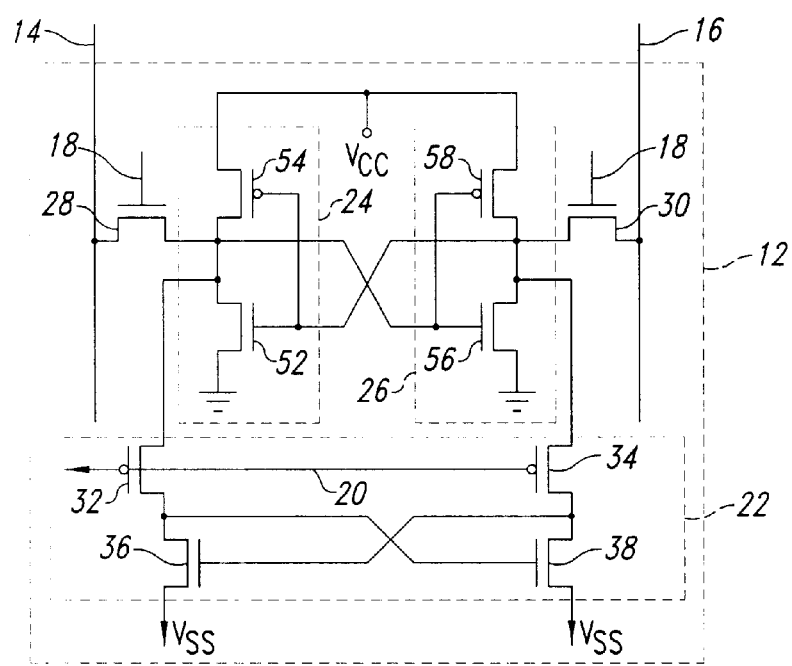
FIG. 4 is a simplified schematic diagram of an equivalent circuit for the memory cells of FIG. 2, in accordance with embodiments of the present invention.
Figure 5:
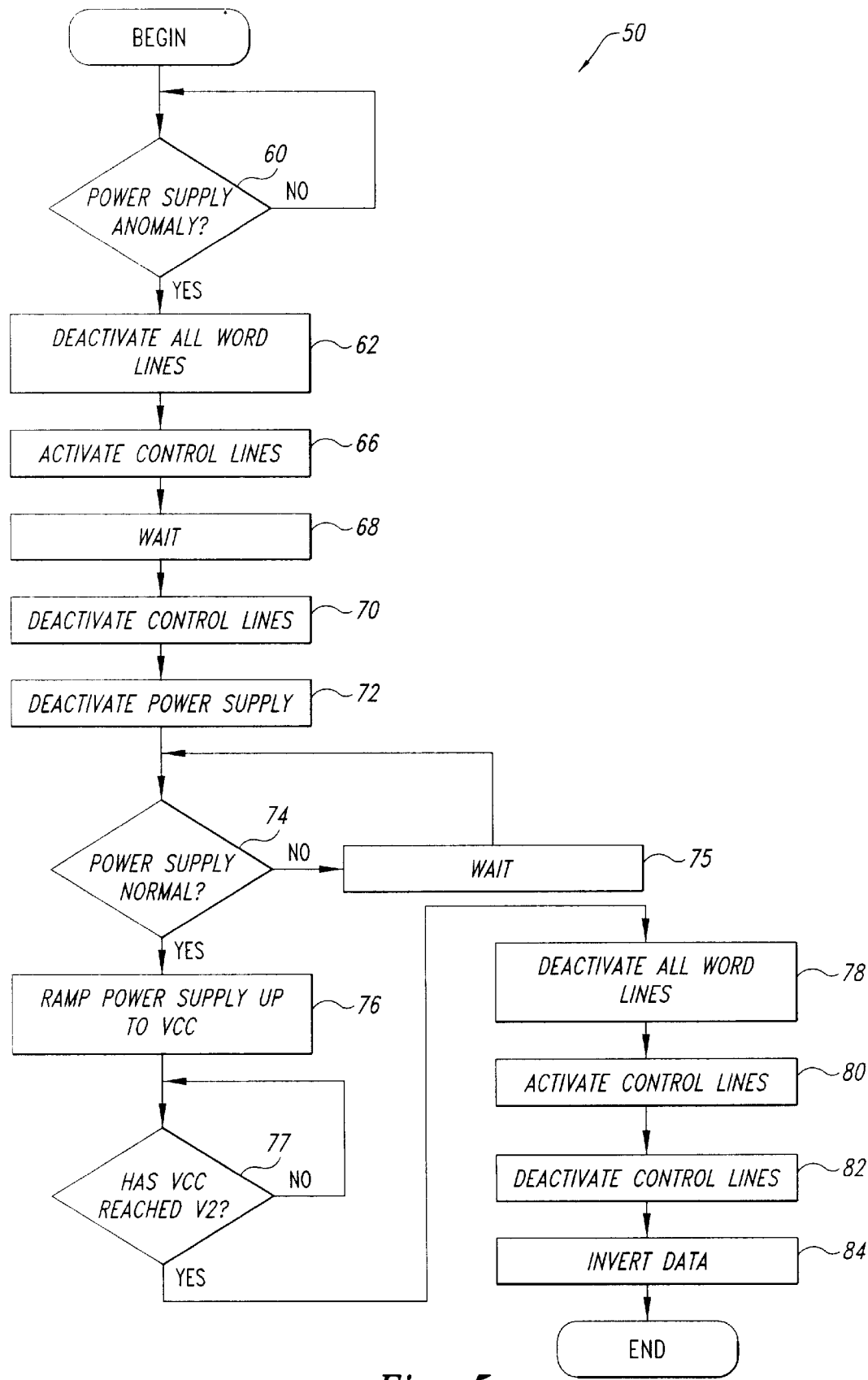
FIG. 5 is a flow chart of a method for operating an SRAM memory including the memory cells of FIGS. 1, 2 and 4, in accordance with embodiments of the present invention.

FIG. 4 is a simplified schematic diagram of an equivalent circuit for the SRAM memory cells 12 of FIGS. 1 and 2, and FIG. 5 is a flow chart of a process 50 for operating the SRAM memory 10 of FIG. 1 including the nonvolatile shadow memory cells 22 of FIGS. 2 and 4, in accordance with embodiments of the present invention. In one embodiment, the inverter 24 in the SRAM memory cell 12 of FIGS. 2 and 4 includes a NMOS FET 52 having a gate that forms an input to the inverter 24, a source coupled to ground and a drain coupled to a drain of a PMOS FET 54 that provides an active load for the NMOS FET 52. The gate of the PMOS FET 54 is coupled to the gate of the NMOS FET 52 and to the input of the inverter 24. The drain of the PMOS FET 54 and the drain of the NMOS FET 52 are coupled to the output of the inverter 24.

Similarly, a NMOS FET 56 and a PMOS FET 58 form the inverter 26. It will be recognized that the PMOS FETs 54 and 58 may be replaced by current sources, such as resistors, coupled between an internal positive power supply $V_{CC}'$ and the drains of the NMOS FETs 52 and 56, at the expense of added electrical power requirements.

The process 50 begins when a query task 60 detects that a first power supply condition has occurred. In one embodiment, the first power supply condition is a power supply anomaly, such as a power supply voltage hiatus or failure. In one embodiment, the power supply anomaly occurs when the power supply voltage $V_{CC}$ has decreased below a first predetermined voltage $V_1$ that is less than a normal operating power supply voltage $V_{CC}$. In one embodiment, the first predetermined voltage $V_1$ is 3.8 volts, with the normal operating power supply voltage $V_{CC}$ being 5 volts, corresponding to a decrease of about twenty-five percent.

When the query task 60 determines that the first power supply condition has not occurred, control remains with the query task 60. When the query task 60 determines that the first power supply condition has occurred, all word lines 18 are deactivated, i.e., set to 0 volts, in a step 62, turning the bit line access FETs 28 and 30 OFF. In one embodiment, the query task 60 is implemented by a conventional comparator (not shown) having a first input coupled to a voltage reference such as a conventional reference diode (not shown) and a second input coupled to the power supply voltage $V_{CC}$ or a voltage related to the power supply voltage $V_{CC}$. For example, a voltage related to the power supply voltage $V_{CC}$ can be a fraction of the power supply voltage $V_{CC}$ as provided by a conventional resistive voltage divider (not shown).

In a step 66, the control lines 20 of FIGS. 1, 2 and 4 are activated, turning ON the shadow memory access FETs 32 and 34, and thereby coupling the gates of the memory FETs 36 and 38 to outputs of the cross-coupled inverters 24 and 26.

In a step 68, the control lines 20 are maintained active for a predetermined interval, during which data from the SRAM memory cell 12 are written to the memory FETs 36 and 38 in the shadow memory cell 22 associated with that SRAM memory cell 12. The thickness of the gate dielectric 44 (FIG. 3) and the density and size of the nanocrystals 47 in the gate dielectric 44 of the memory FETs 36 and 38 have been chosen to facilitate tunneling of electrons from the channel 46 into the nanocrystals 47 when the gate 45 is biased to be more positive than the channel 46. In one embodiment, a bias on the gate 45 need only be on the order of a few volts. In a step 70, the control lines 20 are deactivated, turning the shadow memory access FETs 32 and 34 OFF. In a step 72, the power supply (not shown) supplying the power supply voltage $V_{CC}$ is decoupled from the SRAM memory cells 12.

When a query task 74 determines that the power supply (not shown) that normally supplies the power supply voltage $V_{CC}$ has not yet returned to a normal state, a WAIT is initiated in a step 75 and control returns to the query task 74. In one embodiment, the query task 74 determines that the power supply voltage $V_{CC}$ to the integrated circuit has returned to normal when it reaches a voltage greater than the first predetermined voltage $V_1$ at which the query task 60 determined that a power supply anomaly had occurred, such as four or four and a quarter volts. When the query task 74 determines that the external power supply has returned to a normal state, a conventional power supply conditioning circuit (not shown) begins to ramp the internal power supply voltage $V_{CC}'$ that is coupled to the memory cells 12 (FIGS. 1, 2 and 4) from a small voltage or zero volts towards a normal level, such as five volts, in a step 76.

The step 76 may be implemented with a conventional programmable power supply (not shown) and a conventional microcontroller (not shown). In one embodiment, a group of memory integrated circuits including the SRAM arrays 10 of FIG. 1 are mounted on a circuit board or other carrier (not shown), and a common programmable power supply and microcontroller service the power supply needs for all of the memory integrated circuits including the SRAM arrays 10 in support of the process 50 of FIG. 5.

A query task 77 monitors the internal power supply voltage $V_{CC}'$ to determine when a second power supply condition occurs. In one embodiment, when the query task 77 determines that the internal power supply voltage $V_{CC}'$ has not yet reached a second predetermined voltage $V_2$, the second power supply condition has not occurred and control remains with the query task 77. When the query task 77 determines that the internal power supply voltage $V_{CC}'$ has reached the second predetermined voltage $V_2$, the second power supply condition has occurred and control passes to a step 78. In one embodiment, the second predetermined voltage $V_2$ is about one volt. In another embodiment, the second predetermined voltage $V_2$ is 0.8 volts. What is significant, as is explained later, is that in some embodiments, the second predetermined voltage $V_2$ is substantially less than the first predetermined voltage $V_1$. The query task 77 may be implemented in a fashion similar to that described above with reference to the query task 60. In one embodiment, the comparators of the steps 60 and 77 are also implemented together with the common programmable power supply and microcontroller.

In the step 78, the word lines 18 are all deactivated, turning OFF the bit line access FETs 28 and 30. In a step 80, the control lines 20 are activated, turning ON the shadow memory access FETs 32 and 34 in all of the SRAM memory cells 12. One of the two memory FETs 36 and 38 in each shadow memory cell 22 has had an increased threshold voltage written to it during the step 68 in response to the data that was stored in the associated SRAM memory cell 12. The other of the two memory FETs 36 and 38 will begin to conduct first, setting either the node coupled to the FETs 28 and 32 low, or setting the node that is coupled to the FETs 30 and 34 low. As a result, the data written back to each SRAM memory cell 12 from the associated shadow memory cell 22 is the complement of the data that had been stored in that SRAM memory cell 12 prior to the first power supply condition that was detected in the query task 60.

In a step 82, the control lines 20 are deactivated, turning OFF the shadow memory access FETs 32 and 34. The steps 78, 80 and 82 all occur during a short interval, during which the power supply voltage $V_{CC}$ changes by a relatively small amount. In one embodiment, the power supply voltage changes no more than a few tenths during the steps 78–82. In one embodiment, the short interval is on the order of a few tens of nanoseconds or less, allowing the shadow memory cell 22 to be read prior to a gate bias on the memory FET 36 or 38 that is conducting programming that memory FET 36 or 38.

If the internal power supply voltage $V_{CC}'$ were allowed to reach, for example, five volts, or even the first predetermined voltage $V_1$, before the steps 78–82 took place, the memory FETs 36 or 38 that are conducting could be programmed by a drain voltage developed by the other memory FET 38 or 36 that is in the same shadow memory cell 22. For example, if the memory FET 36 remains OFF, a logic "1" is provided at the drain of the memory FET 36. The gate of the memory FET 38 is coupled to the drain of the memory FET 36. Thus, if the internal power supply voltage $V_{CC}'$ is at or near the level of the first predetermined voltage, after a delay similar to the delay in the WAIT of step 68 of the process 50, the nanocrystals 47 in the gate dielectric 44 of the memory FET 38 will also have electrons stored on them. This could result in improper operation of the shadow memory cell 22 and therefore of the SRAM memory cell 12.

In a step 84, the data stored in the SRAM memory cells 12 are inverted. The process 50 then ends and normal operation of the SRAM memory array 10 may resume.

A first method for altering the data stored in the SRAM 10 in the step 84 is to sequentially read data from each SRAM memory cell 12 to an external bus. After each SRAM memory cell 12 is read, the data are inverted and then are written back to each SRAM memory cell 12, before the next SRAM memory cell is read. Other methods for reading data from each cell, inverting the data and then writing the inverted data back to the appropriate SRAM memory cell 12 may be employed.

A second method is to repeat the process 50, i.e., treat the recovery from the first power supply condition or power supply anomaly as a second example of the first power supply condition as detected by the step 60. The data from each SRAM memory cell 12 are stored again in the shadow memory 22 as in the steps 66 and 68. The power supply is then restarted as in the steps 74, 76 and 77 and the data from the shadow memory 22 are reloaded into the associated SRAM memory cell 12 as in the steps 78, 80 and 82.

A third method is to read data from the SRAM memory cells 12 onto the data bus. The data on the data bus are then inverted and written back into the memory cell 12 from which the data were read. In any of these methods, the data that were originally stored in the SRAM memory cell 12 are restored.

The process 50 of FIG. 5 and the operation of the circuit of FIG. 4 may be more readily understood from an example, as follows. Assume that initially the output of the inverter 24 is at logic "0", prior to the query task 60 of FIG. 5 detecting the first power supply condition. In the step 62, the word lines 18 of FIGS. 1, 2 and 4 are deactivated, turning OFF the bit line access FETs 28 and 30 and isolating all of the SRAM memory cells 12 from the BIT 14 and BIT* 16 data lines. In the step 66, the control line 20 is activated, turning ON the shadow memory access FETs 32 and 34 in each of the shadow memory cells 22, and, in the step 68, electrons are stored in the nanocrystals 47 embedded in the gate dielectric 44 of the memory FET 36, because the gate of the memory FET 36 is biased to logic "1" by the output of the inverter 26.

When power is restored to the SRAM memory cell 12 and the query task 77 has determined that the second power supply condition has occurred, the word lines 18 are deactivated, turning OFF the bit line access FETs 28 and 30 in the step 78. The control lines 20 are activated in the step 80, turning the shadow memory access FETs 32 and 34 ON. Because the memory FET 36 has an increased threshold voltage due to the charge stored in the nanocrystals 47, the memory FET 38 begins to conduct at a lower internal power supply voltage $V_{CC}'$ than the memory FET 36, i.e., before the memory FET 36 can begin to conduct. As a result, the output from the memory FET 38 to the inverter 26, which is also the input to the inverter 24, is set to logic "0". The control lines 20 are then deactivated in the step 82, turning OFF the shadow memory access FETs 32 and 34.

As a result, the SRAM memory cell 12 now is storing the inverse of the data that was stored in the SRAM memory cell 12 when the power supply anomaly occurred. Following the step 84, the data stored in the SRAM memory cell 12 is restored, and normal operation of the SRAM memory array 10 may resume.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of operating a memory cell comprising:
   detecting a first power supply condition, and, when the first power supply condition occurs:
   disabling memory cell access to bit lines;
   enabling a series of shadow memory access FETs within the memory cells;
   coupling data from the memory cells to associated memory FETs within the memory cells, the memory FETs including nanocrystals of semiconductor material in gate dielectrics of the memory FETs; and
   storing electrons in the nanocrystals to represent the data stored in the memory cell associated with the memory FETs.

2. The method of claim 1, further comprising:

detecting a second power supply condition;

turning OFF memory cell access FETs;

turning ON shadow memory cell access FETs;

coupling data from the memory FETs to the associated memory cell; and storing the data in the associated memory cell.

3. The method of claim 2, further comprising, after storing the data in the associated memory cell:

turning OFF the shadow memory cell access FETs; and decoupling the power supply from the memory cell.

4. The method of claim 1, wherein detecting a first power supply condition comprises determining when a voltage of the first power supply has decreased by twenty-five percent or more.

5. The method of claim 1, wherein detecting a first power supply condition comprises determining when a voltage of the first power supply has decreased to a first predetermined level.

6. The method of claim 2, wherein detecting a second power supply condition comprises detecting when a power supply voltage has reached one volt.

7. The method of claim 2, wherein detecting a second power supply condition comprises detecting when a power supply voltage has reached 800 millivolts.

8. A method of operating a memory cell comprising:

detecting when a power supply voltage from a power supply decreases below a first predetermined voltage, and, when the power supply voltage decreases below the first predetermined voltage:

coupling data from memory cells to associated memory FETs within the memory cells, the memory FETs including nanocrystals of semiconductor material in gate dielectrics of the memory FETs; and storing electrons in the nanocrystals to represent the data stored in the memory cell associated with the memory FETs.

9. The method of claim 8, further comprising, after detecting when a power supply voltage decreases below a first predetermined voltage and prior to coupling data from memory cells to associated memory FETs within the memory cells:

disabling memory cell access to bit lines; and enabling a series of shadow memory access FETs within the memory cells.

10. The method of claim 8, further comprising, after storing electrons in the nanocrystals:

decoupling the power supply from the memory cell;

coupling the power supply to a ramping circuit; and detecting a second power supply condition, and, when the second power supply condition occurs:

turning OFF memory cell access FETs;

turning ON shadow memory cell access FETs;

coupling data from the memory FETs to the associated memory cell; and storing the data in the associated memory cell.

11. The method of claim 10, wherein detecting a second power supply condition comprises detecting when a power supply voltage has reached one volt.

* * * * *